United States Patent [19]

Kelly et al.

[11] Patent Number: 5,434,443
[45] Date of Patent: Jul. 18, 1995

[54] SEMICONDUCTOR SWITCH INCLUDING A POWER TRANSISTOR INTEGRATED WITH A TEMPERATURE SENSOR THEREFOR

[75] Inventors: Brendon P. Kelly; Royce Lowis, both of Stockport; Paul T. Moody, Oldham, all of England

[73] Assignee: U.S. Philips Corporation, New York, N.Y.

[21] Appl. No.: 240,949

[22] Filed: May 10, 1994

Related U.S. Application Data

[63] Continuation of Ser. No. 15,697, Feb. 9, 1993, abandoned.

[30] Foreign Application Priority Data

Mar. 20, 1992 [GB] United Kingdom ............... 9206058

[51] Int. Cl.[6] .................... H01L 27/088; H01L 29/78
[52] U.S. Cl. .................... 257/467; 257/360; 257/469
[58] Field of Search ............... 257/467, 360, 469

[56] References Cited

U.S. PATENT DOCUMENTS

| | | | |
|---|---|---|---|
| 4,730,228 | 3/1988 | Eimzinger et al. | 361/103 |
| 4,896,196 | 1/1990 | Blanchard | 257/467 |
| 4,903,106 | 2/1990 | Fukunaga et al. | 257/467 |
| 4,924,111 | 5/1990 | Anderson et al. | 257/467 |
| 4,931,844 | 6/1990 | Zommer | 257/467 |
| 5,034,796 | 7/1991 | Zommer | 257/467 |
| 5,063,307 | 11/1991 | Zommer | 257/467 |

Primary Examiner—Jerome Jackson
Attorney, Agent, or Firm—Steven R. Biren

[57] ABSTRACT

A semiconductor switch includes a power FET and a temperature sensor for providing a control signal to switch off the power FET when it reaches a predetermined thermal condition, such as a particular temperature. The power FET consists of a semiconductor body having a first region (13) of a first conductivity type adjacent one major surface (10a) thereof, and a plurality of cells (11). Each such cell has a second region (32) of the second (opposite) conductivity type provided within the first region (13), a third region (33) of the first conductivity type formed within the second region (32), and an insulated gate overlying a conduction channel in the second region (32) between the first and third regions (33 and 13). The temperature sensor (2) is formed within the semiconductor body (10) and consists of a number of further cells (11') of the same structure as the cells (11) of the power FET. The insulated gate of each further cell (11') is electrically connected to the third region (33') so as to form a parasitic bipolar transistor having a leakage current which varies with temperature, thereby enabling the temperature sensor to provide a control signal to switch off the power FET when the predetermined thermal condition is reached.

11 Claims, 2 Drawing Sheets

SEMICONDUCTOR SWITCH INCLUDING A POWER TRANSISTOR INTEGRATED WITH A TEMPERATURE SENSOR THEREFOR

This is a continuation of application Ser. No. 08/015,697, filed Feb. 9, 1993 abandoned.

BACKGROUND OF THE INVENTION

This invention relates to a semiconductor switch and a temperature sensing circuit for such a switch.

U.S. Pat. No. 4,730,228, issued Mar. 8, 1988, describes a temperature sensing circuit in which the temperature of a power semiconductor device is sensed by a bipolar transistor. The bipolar transistor is arranged in series with the main conductive path of a depletion mode (normally on) insulated gate field effect transistor (IGFET or MOSFET). The bipolar transistor has an open base connection and is in thermal contact with the power semiconductor device. For example, the bipolar transistor may be provided in the same semiconductor body as the power semiconductor device within a recess in the power semiconductor device. The depletion mode IGFET may also be integrated in the same semiconductor body but at a location remote from the power semiconductor device. In operation of the circuit described in said patent, when the circuit is at room temperature an off-state or leakage current flows through the open-base bipolar transistor and the depletion-mode IGFET acts as a current source. As the temperature of the power semiconductor device, and thus of the bipolar transistor, increases, the current through the bipolar transistor increases until it reaches that demanded by the depletion-mode IGFET. The internal resistance of the IGFET then increases sharply, resulting in production of a control signal for switching off the power semiconductor device.

Although the circuit described in said patent enables the thermally responsive bipolar transistor to be placed in good thermal contact with the power semiconductor device, in practice significant modifications would have to be made to the mask set used to manufacture the power semiconductor device in order to enable inclusion of the bipolar transistor.

SUMMARY OF THE INVENTION

According to one aspect of the present invention, there is provided a semiconductor switch comprising a power semiconductor device and a temperature sensor for providing a control signal to switch off the power semiconductor device when the power semiconductor device has a predetermined thermal condition. The power semiconductor device comprises a semiconductor body having a first region of one conductivity type adjacent one major surface, and a plurality of insulated gate field cells. Each device cell comprises a second region of said body of opposite conductivity type provided within the first region, a third region of the aforesaid one conductivity type provided within the second region, and an insulated gate overlying a conduction channel which is formed thereby during operation in the second region for providing a gateable conductive path between the third and first regions. The temperature sensor is a thermally responsive semiconductor device formed within the semiconductor body and comprises a number of further device cells Each further device cell has a second region provided within the first region, a third region provided within the second region, and an insulated gate overlying a conduction channel region which is formed thereby during operation in the second region of the further device cell, said gate being electrically connected to the third region. The further device cells thereby form a parasitic bipolar transistor having a leakage current which varies with temperature and which the temperature sensor provides as a control signal to switch off the power semiconductor device when the predetermined thermal condition exists.

Thus, in a semiconductor switch in accordance with the invention the thermally responsive semiconductor device is formed by a number of device cells similar, generally identical, to the device cells forming the power semiconductor device. Consequently, very little modification of the mask set which is used to produce the power semiconductor device is required in order to allow incorporation of the thermally responsive device.

The insulated gate of each further device cell may be connected to its own third region or to a third region of the power semiconductor device. Generally, the insulated gate of each further device cell may be electrically shorted to the third region by a simple modification of the mask which is used to define the metallisation level.

The second and third regions of the further device cells may be electrically shorted so as to provide a base-emitter shorted parasitic bipolar transistor. This should provide an improved output and higher signal. This can be achieved very simply, as it is conventional in the manufacture of a power insulated gate field effect such as a power MOSFET or IGBT (Insulated Gate Bipolar Transistor) for the source (third) region to be shorted to the body (the channel-defining second region) and accordingly no mask modification is necessary to achieve the emitter-base short. Alternatively, by modification of the appropriate masks, the second regions of the further device cells may be left floating so as to define an open base parasitic bipolar transistor.

At least the second regions of the power semiconductor device may each have a more highly doped central area. In the case of the power insulated gate field effect device this serves to facilitate good contact by the metallisation and to improve ruggedness.

The further device cells may be provided adjacent the periphery of the power semiconductor device, which should simplify the affect of any metallisation modifications. As an alternative, the further device cells may be provided amongst the device cells which form the power semiconductor device so as to enable a more accurate detection of the temperature of the power semiconductor device. This can be achieved relatively simply, without detrimentally affecting device yield, because the thermally responsive device is made up of device cells similar, generally identical, to those of the power semiconductor device. It may even be possible for the further device cells which form the thermally responsive device to be distributed throughout the power semiconductor device (e.g. with a number of further cells at two or more different locations). However, current sharing with the power semiconductor device will normally be so good that such distribution would not significantly increase the accuracy of detection of the thermal condition of the power semiconductor device. The further device cells may be provided in a linear or any similar arrangement which maximises the ratio between the periphery of and the area occupied by the thermally responsive semiconductor device so as to increase its sensitivity to temperature changes.

Generally, the temperature sensor will be arranged to detect when the temperature of the power semiconductor device reaches a predetermined value. However, the temperature sensor may be used, provided the rate of change of voltage across the semiconductor body is small, to detect the temperature difference between centre cells and edge cells of the power device. In such a case the temperature sensor may comprise a further thermally responsive device similar to the thermally responsive semiconductor device, one of the thermally responsive semiconductor devices being provided adjacent and the other remote from the power semiconductor device. Means responsive to the two thermally responsive devices provides a control signal to switch off the power semiconductor device when the difference in the temperatures sensed by the two thermally responsive semiconductor devices exceeds a predetermined value.

One of the two thermally responsive devices may be provided adjacent the periphery of or actually within the power semiconductor device, and the other may be further from the periphery so as to enable the temperature difference between the two thermally responsive devices to be determined. Under certain conditions in power semiconductor devices such as power MOS-FETs, for example, where a low resistance (say about 100 mΩ), load is present between ground and such device, the temperature at the centre of the device rises much more quickly than that of the surrounding semiconductor body, so that a steep temperature gradient occurs at the periphery of the active semiconductor device. The use of two spaced thermally responsive devices allows this steep temperature gradient to be detected and to be used to provide a signal to switch off the active semiconductor device before it overheats significantly. Accordingly, excessive temperatures can be detected quickly and the circuit can be particularly sensitive to temperature changes.

The present invention also provides a temperature sensing circuit for providing a control signal to switch off a power semiconductor device when the power semiconductor device has a predetermined thermal condition, the circuit comprising first and second transistors connected in a current mirror arrangement, a current source connected in series with the first and second transistors and a thermally responsive device in thermal communication with the power semiconductor device, the thermally responsive device passing a current which increases with temperature and being connected to an auxiliary current source for the second transistor for causing the second transistor to become increasingly switched off as the temperature sensed and thus the current passed by the thermally responsive device increases, until the temperature sensor provides a control signal for switching off the power semiconductor device when the predetermined thermal condition is reached.

In a temperature sensing circuit in accordance with the invention, the thermally responsive device passes a current which increases with temperature and this current is used as an auxiliary current source for the current mirror arrangement. Such a circuit can operate with very small current and has a good gain.

A respective current source may be connected in series with each of the first and second transistors, and the thermally responsive device may be connected in series with the auxiliary current source which is connected in parallel with the current source of the second transistor. Thus, the current passed by the thermally responsive device will offset the current of the auxiliary current source connected to the current mirror arrangement. The current sources may have any suitable form, but preferably are formed by resistors.

In one preferred example, the present invention provides a temperature sensing circuit for sensing the temperature of a power semiconductor device and for providing a control signal to switch off the power semiconductor device when the sensed temperature reaches a predetermined temperature. The temperature sensing circuit comprises, first and second power supply lines, first and second transistors each having first and second main electrodes and a control electrode, the first electrodes of the first and second transistors each being connected by a respective one of first and second resistors to the first power supply line and the control electrode of the first transistor being connected to its first electrode and to the control electrode of the second transistor so as to form a current mirror arrangement. Third and fourth resistors are connected between the first and second transistors, respectively, and the second power supply line so as to form current sources for the first and second transistors, a fifth resistor being connected in parallel with the fourth resistor. An output stage for providing the control signal is connected to the first electrode of the second transistor and to a thermally responsive device in thermal communication with the power semiconductor device. The thermally responsive device passes a current which increases with temperature, and is connected in series with the fifth resistor to provide an auxiliary current source which causes the second transistor to become increasingly switched off as the temperature sensed and thus the current passed by the thermally responsive device increases, until at the predetermined temperature the output stage provides a control signal for switching off the power semiconductor device.

The output stage may comprise a third transistor having a control electrode connected to the first electrode of the second transistor and having first and second electrodes connected via respective resistors to the first and second power supply lines, and also a fourth transistor having a control electrode connected to the first electrode of the third transistor, a first main electrode connected via a further resistor to the first power supply line and a second main electrode connected to the second power supply line The first electrode of the fourth transistor is connected to an output line for providing the control signal for switching off the power semiconductor device when the predetermined temperature is reached.

The thermally responsive device may be a bipolar transistor, although other devices (e.g. pn diode) could be used. In particular, the bipolar transistor may be a parasitic bipolar transistor formed within an insulated gate field effect device. Such an arrangement has particular advantages where the power semiconductor device is a device as described above comprising a semiconductor body having a first region of one conductivity type adjacent one major surface and a plurality of cells which form an insulated gate field effect device. In such an example, the cells of the thermally responsive semiconductor device are similar, generally identical, to the cells forming the power semiconductor device. Consequently, very little modification of the mask set which is used to produce the power semiconductor device is required in order to allow incorporation of the thermally responsive device with the power semiconductor device.

Such a, this circuit can handle very low substrate voltages, in the range of 200-300 mV (millivolts) at normal operating temperatures, for example 20°-25° C., and as low as 100 mV at higher temperatures, and has a quick settling time compared with the high value lead resistance which may be connected in series with the power semiconductor device.

BRIEF DESCRIPTION OF THE DRAWINGS

Embodiments of the invention will now be described, by way of example, with reference to the accompanying drawings, in which.

Figure 2:
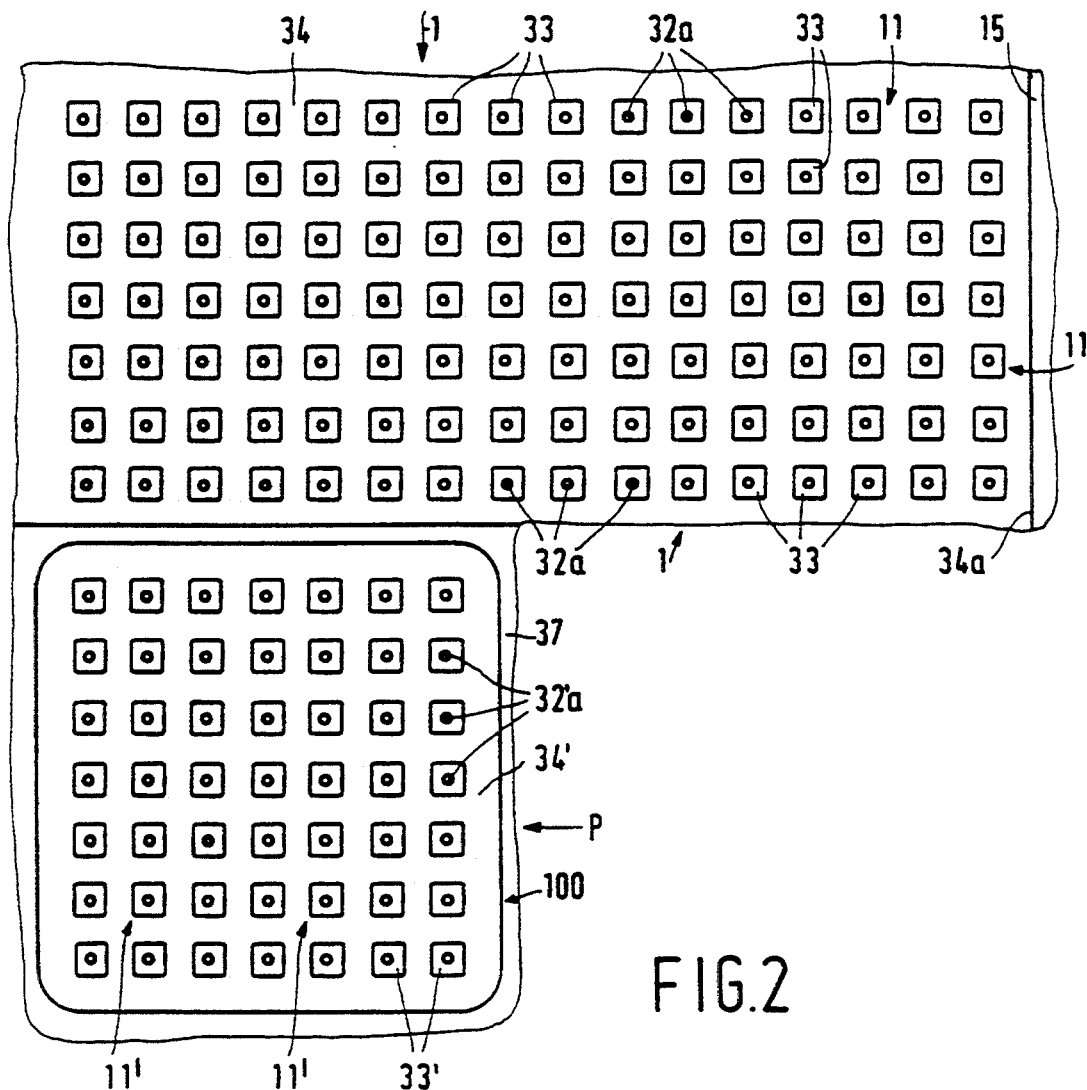
FIG. 2 is a plan view of part of a semiconductor body within which a power semiconductor device and a thermally responsive device of a temperature sensing circuit in accordance with the invention are integrated.
Figure 3:
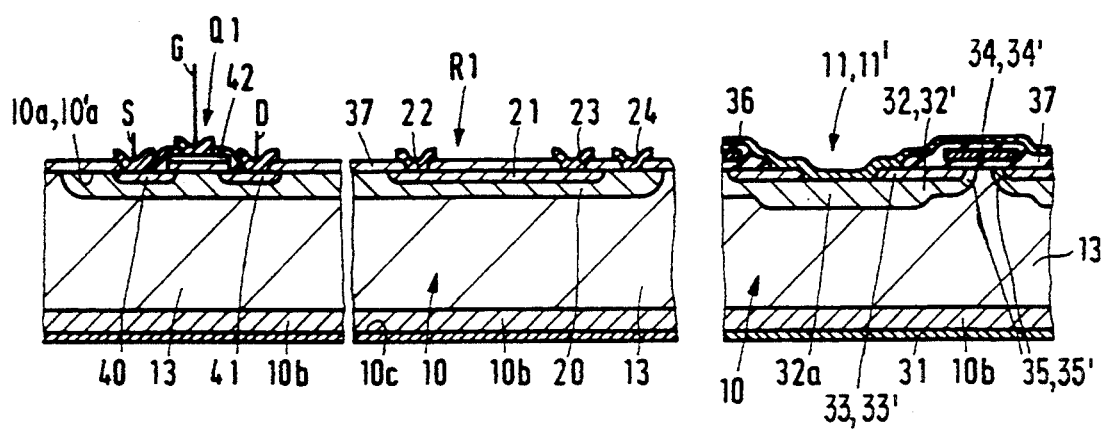
FIG. 3 is a cross-sectional view, part broken-away, of a semiconductor body within which a power semiconductor device and various components of the circuit illustrated in FIG. 1 are integrated.

It should be understood that FIGS. 2 and 3 are merely schematic and are not drawn to scale. In particular, certain dimensions such as the thickness of layers or regions may have been exaggerated whilst other dimensions may have been reduced. It should also be understood that the same reference numerals are used throughout the Figures to indicate the same or similar parts.

DESCRIPTION OF THE PREFERRED EMBODIMENTS

Figure 1:
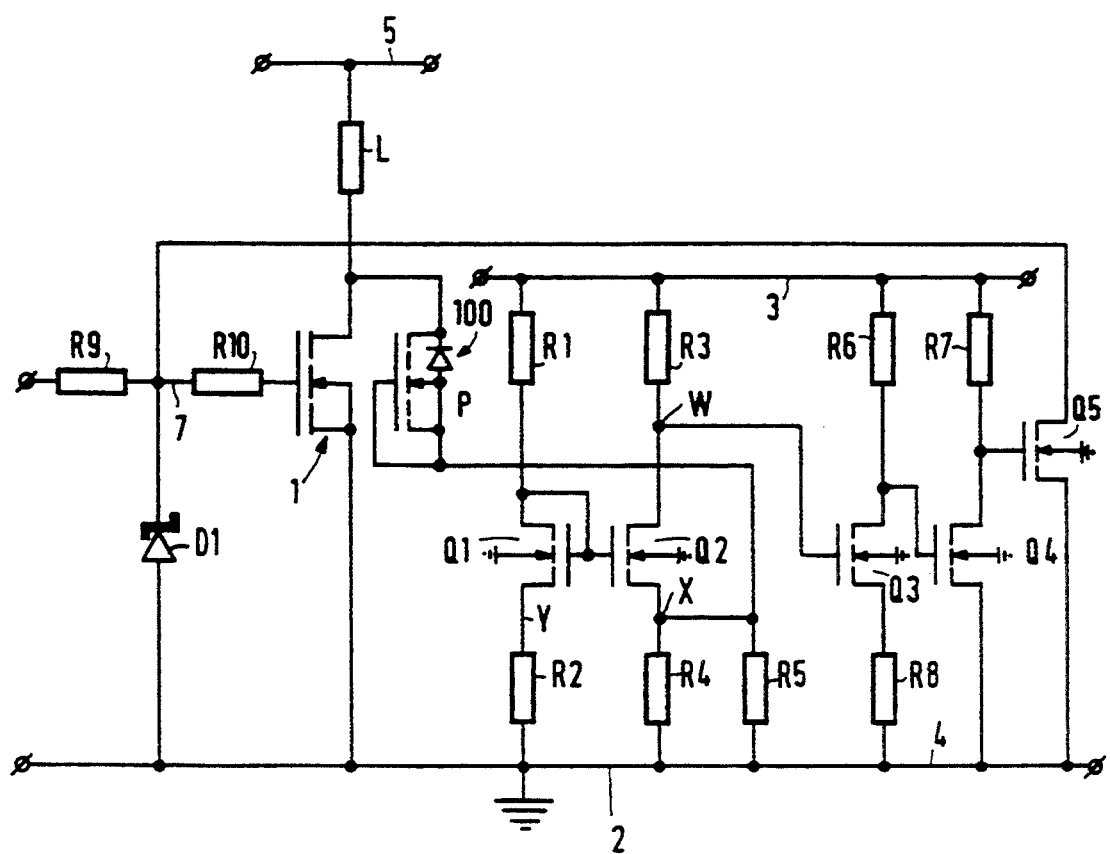
FIG. 1 illustrates a circuit diagram of one example of a temperature sensing circuit in accordance with the invention.

Referring now to FIG. 1 there is illustrated a semiconductor switch comprising a power semiconductor device 1 and a temperature sensor 2 for providing a control signal to switch off device 1 when the power semiconductor it reaches a predetermined thermal condition, for example a predetermined temperature.

As shown in FIGS. 2 and 3, the power semiconductor device 1 comprises a semiconductor body 10 having a first region 13 of a first conductivity type adjacent one major surface 10a and a plurality of insulated gate field effect device cells 11 each of which comprises a second region 32 of a second (opposite) conductivity type within the first region 13, a third region 33 of the first conductivity type provided within the second region 32, and an insulated gate 34 overlying a conduction channel 35 which is formed thereby during operation in the second region 32 for providing a gateable conductive path between the third and first regions 33 and 13. The temperature sensor 2 comprises a thermally responsive semiconductor device 100 formed within the semiconductor body 10 and comprising a number of further similar to the cells 11. Thus, each further device cell 11' comprises a further second region 32 within the aforesaid first region 13, a further third region 33' within the further second region 32', and a further insulated gate 34' overlying a conduction channel 35 which is formed thereby during operation in the second region 32'. The insulated gate 34' of each further device cell 11' is electrically connected to, either the further third region 33' thereof or to the third region 33 of a cell 11 of the power semiconductor device 1, so that the further device cells 11' form a parasitic bipolar transistor having a leakage current which varies with temperature. Such leakage current enables temperature sensor 2 to provide a control signal to switch off the power semiconductor device 1 when the predetermined thermal condition exists.

Thus, in a semiconductor switch in accordance with the invention the thermally responsive semiconductor device 100 is provided by a number of device cells 11' similar, generally identical, to the device cells 11 forming the power semiconductor device 1. Therefore very little modification of the mask set which is used to produce the power semiconductor device 1 is required in order to allow incorporation of the thermally responsive device 100.

FIG. 1 illustrates one example of a temperature sensing circuit 2 which may incorporate the thermally responsive device 100 mentioned above and which may be used to provide a control signal to switch off the power semiconductor device 1 shown in FIG. 2 When the temperature sensed by the thermally responsive device 100 reaches the predetermined temperature.

The circuit 2 comprises first and second transistors Q1 and Q2 connected in a current mirror arrangement and a current source R2,R4 connected in series with the first and second transistors Q1 and Q2. The thermally responsive device 100 in thermal communication with the power semiconductor device 1 passes a current which increases with temperature and is connected to an auxiliary current source R5. Thus current is diverted from the second transistor Q2 for the second transistor Q2, causing it to become increasingly switched off as the temperature sensed and thus the current passed by the thermally responsive device 100 increases until, at the predetermined temperature, the temperature sensor provides a control signal for switching off the power semiconductor device 1.

as shown in FIG. 1, respective current sources R2,R4 are connected in series with each of the first and second transistors Q1 and Q2, and the thermally responsive device 100 is connected in series with a resistor R5 which is connected in parallel with the current source R4 of the second transistor Q2. Thus, as will be explained in greater detail below, the current passed by the thermally responsive device 100 is used to divert the current in the source degeneration resistor R5 connected to the current mirror arrangement R2,R4.

Referring now specifically to the example illustrated in FIGS. 1 to 3, the temperature sensing circuit 2 has first and second power supply lines 3 and 4. The first and second transistors Q1 and Q2 are both n-channel enhancement mode (normally off) IGFETs (insulated gate field effect transistors ) having their first (drain) main electrodes connected via respective resistors R1 and R3 to the first power supply line 3 and their second (source) main electrodes connected to the second power supply line 4, which is in this example earth. The control or gate electrodes of the first and second transistors Q1 and Q2 are connected together, and the control electrode of the first transistor Q1 is connected to its drain electrode to form a current mirror arrangement. As shown, the back gates of the first and second transistors Q1 and Q2 are not connected to their respective sources in the normal manner but are connected to earth (ground), that is to the second power supply line 4. In the interests of clarity in FIG. 1, this connection is shown merely by an earth symbol on the back gates and not by an actual connection line to the second power supply line 4. Of course, the back gates of transistors Q1 and Q2 could be connected to their respective sources in normal manner although this might require some adjustment of the circuit parameters.

A respective current source connects the source electrode of each of the transistors Q1 and Q2 to the second power supply line 4. The current sources could be of any suitable form but in this example are provided as resistors R2 and R4 which may be of the type to be described below with reference to FIG. 3. As alternatives to the use of resistors as current sources, diode-connected depletion mode IGFETs could be used.

A further resistor R5 is connected in parallel with the resistor R4 and acts as a current source degeneration resistor for the transistor Q2 so that, as will be explained below, at normal temperatures of the power semiconductor device 1 the current drawn by transistor Q2 is not equal to that drawn by transistor Q1. Again any suitable form of current source may be used in place of the resistor R5.

The thermally responsive device 100 comprises, as will be explained in greater detail below with reference to FIGS. 2 and 3, a small power MOSFET formed by a number of device cells 11' formed in the same semiconductor body 10 as the power MOSFET 1 whose temperature is to be detected. In this example, the power MOSFET 1 is an n-channel enhancement mode MOSFET and the thermally responsive device 100 is therefore also an n-channel enhancement mode MOSFET. The gate electrode of the thermally responsive device 100 is connected to its source electrode as shown in FIG. 1 so that the thermally responsive device 100 is provided by a parasitic bipolar transistor P within the small power MOSFET. The parasitic bipolar transistor P has, in this case, its base and emitter regions shorted by virtue of the fact that the source metallisation of the power MOSFET 1 shorts its third or source regions 33, to the channel-defining second or body regions 32'. This should enable a higher gain and thus higher output than could be achieved with an open (or floating) base arrangement. However by appropriate modification of the metallisation mask, the parasitic bipolar transistor P may have a floating base.

In the example illustrated in FIG. 1, the power MOSFET 1 itself forms a low-side switch having its drain electrode connected via a load L, for example a light bulb, to a positive power supply line 5. The gate electrode of the power MOSFET 1 is connected to an input control line 7 which receives, via an appropriate input circuit, signals for controlling switching on and off of the power MOSFET 1. In the example illustrated, the input circuit comprises series-connected resistors R9 and R10 and a zener diode D1 connected between the node between the two resistors R9 and R10 and the power supply line 4. The zener diode D1 serves to protect the insulated gate 34 of the power semiconductor device 1.

The source electrode of the thermally responsive device 100 is connected in series with the source degeneration resistor R5 so that, as will be described below, the thermally responsive device 100 provides an additional current source for the transistor Q2. The drain electrode of the second transistor Q2 is connected at junction W to the gate electrode of an n-channel enhancement mode third IGFET Q3 having its drain electrode connected via a fourth resistor R6 to the first power supply line 3 and its source electrode connected via a fifth resistor R8 to the second power supply line 4. The drain electrode of the third IGFET Q3 is connected to the gate electrode of a fourth n channel enhancement mode IGFET Q4 having its drain electrode connected via a resistor R7 to the first power supply line 3 and having its source electrode connected to the second power supply line 4. The two transistors Q3 and Q4 form an inverting output stage as will be discussed below. The drain electrode of IGFET Q4 is connected to a further n-channel enhancement mode IGFET Q5 which has its source electrode connected to the second power supply line 4. The IGFET Q5 forms an output transistor and its drain electrode is connected via an output line 6 and the resistor R10 to the insulated gate 34 of the power semiconductor device 1.

The structure of various components of the circuit 2 shown in FIG. 1 will now be described with reference to FIGS. 2 and 3 in which FIG. 2 illustrates a top plan view of part of the semiconductor body 10 within which the power MOSFET 1 and the thermally responsive device or auxiliary MOSFET 100 are formed while FIG. 3 illustrates a cross-sectional view through part of the semiconductor body 10.

In order to show the structure of the MOSFETs 1 and 100, source, gate and interconnection metallisation have been omitted in FIG. 2. As can be seen clearly from FIG. 2, the power MOSFET 1 comprises a plurality of device or source cells 11 each of which comprises a second or body region 32, a third or source region 33 within the second region 32 so that the second and third regions 32 and 33 define therebetween a conduction channel region 35 (see FIG. 3) over which the insulated gate 34 extends between each third region 33 and the first region 13 which forms at least part of a common drain region. Each second region 32 has a relatively deep relatively highly doped central region 32a which extends up to the surface 10a within the associated source region 33 to enable the source region 33 to be shorted to the second region 32 in normal manner to enable good contact by the source metallisation and to improve the ruggedness of the device. Typically the power MOSFET 1 may consist of many hundreds of thousands of source cells 11. The periphery 34a of the insulated gate 34 may extend up onto field oxide 15 surrounding the edge of the power MOSFET 1 in conventional manner and, although not shown, conventional edge termination such as Kao's rings and/or field plates may be provided at the periphery of the power MOSFET 1.

As mentioned above, the thermally responsive device 100 is effectively a much smaller version of the power MOSFET 1. In this example, as shown, the thermally responsive device comprises 49 source cells 11' each formed by a second region 32' containing a third region 33' and defining with the third or source region 33' a conduction channel 35' (see FIG. 3) over which the insulated gate 34' extends between each third region 33' and the first region 13 which forms at least part of a common drain region of the auxiliary MOSFET. Again a central region 32'a of each second region 32' extends to the surface 10'a within each source cell 11'. The number of source cells 11' forming the thermally responsive device 100 will of course depend on the desired characteristics and could be more or less than shown. Although not shown in FIG. 2, the insulated gate of the thermally responsive device 100 is connected directly to its source electrode. This can be achieved simply by modifying the metallisation mask in the area of the thermally responsive device 100 so that there is no separation of the source and gate metallisation of the thermally responsive device. The auxiliary MOSFET 100 thus provides a parasitic bipolar transistor P in which the source and body regions 33' and 32' provide the emitter and base regions and the common first region 13 provides the collector region of the bipolar transistor P. By virtue of the source-body short provided by the source metallisation, the parasitic bipolar P has its base shorted to its emitter.

As indicated above, FIG. 3 illustrates, by way of a cross-section through the semiconductor body 10, typical structures for the source cells 11 and 11' of the MOSFETs 1 and 100. In addition, FIG. 3 shows typical structures for the resistors R1 to R8 and the n-channel IGFETs Q1 to Q5. It will be appreciated that only one resistor R1 and one IGFET Q1 are shown in FIG. 3 because the structures of the resistors R1 to R8 and all the IGFETs Q may be similar. In addition, because the structures of the source cells 11 and 11' of the power MOSFET 1 and the thermally responsive device 100 are also similar the cross-section of only one source cell 11,11' is shown.

In the example of FIG. 3, the semiconductor body 10 comprises a relatively high doped n conductivity type monocrystalline silicon substrate 10b onto which is provided a relatively lowly doped n conductivity type epitaxial layer which forms the first region 13, The relatively highly doped substrate 10b provides a drain contact region which makes ohmic contact to metallisation 31 on the other major surface 10c of the semiconductor body 10, The metallisation 31 forms at least part of the connected drain electrodes of the power MOSFET 1 and the thermally responsive device 100.

The resistors R1 to R8 may have any suitable form and could be, for example, simple diffused resistors or doped polycrystalline silicon resistors. In the example being illustrated, the resistors R1 to R8 are formed in the first region 13 of the semiconductor body 10 by a region 20 of the opposite conductivity type formed within the first region 13 and a further region 21 of the one conductivity type formed within the second region 20, first and second electrodes 22 and 23 being spaced apart on the third region 21 so that a resistive path is provided by the third region 21 between the first and second electrodes 22 and 23. A reference electrode 24 is provided for connecting the region 20 to a reference potential, the second power supply line 4 in this example. The region 20 is formed as a planar region by introducing, using an appropriate mask, p conductivity type impurities, generally boron ions with a dose (which determines the surface concentrations) in the region $10 \times 10^{12}$ to $13 \times 10^{12}$ atoms cm$^{-2}$, while the region 21 is formed as a planar region within the region 20 by introducing impurities using an appropriate mask with a dose in the region of $2 \times 10^{12}$ to $3 \times 10^{12}$ atoms cm$^{-2}$. The impurity concentrations within the regions 20 and 21 are such that the temperature coefficients of resistance of the diffused resistor formed by the third region 21 and the junction field effect transistor like structure formed by the regions 20 and 21 counteract to provide the resistor with a temperature coefficient of resistance $\alpha$ which increases with absolute temperature such that the relative temperature coefficient of resistance referred to the sensed temperature is substantially constant.

The n-channel enhancement transistors Q1 to Q5 may have any suitable form. In this example each transistor Q1 to Q5 is a lateral IGFET and may have the structure shown in FIG. 3 where the n-channel IGFET Q1 (for example) is formed in a relatively lowly doped p conductivity type isolation well having a surface dopant concentration of the order of $2-3 \times 10^{12}$ atoms cm$^{-2}$ which is connected to the second supply line 4 (generally earth) via an electrode. In this example the lateral IGFETs Q1 to Q5 may be formed in the same region 20 as the resistors R1 to R8 so that the electrode 24 provides the back gate connection to the second supply line 4. The source and drain regions 40 and 41 of the IGFETs Q1 to Q5 may be formed with the source regions 33.

In manufacture of the structure shown in FIG. 3, the insulated gates 34 and 34' of the MOSFETs 1 and 100 and the insulated gates 42 of the IGFETs Q1 to Q5 are first defined after definition of any field oxide 15 and formation of the region 20. Generally the insulated gates will comprise a thermal gate oxide layer followed by a doped polycrystalline silicon layer. Impurities for forming the relatively deep relatively highly doped central regions 32a, 32'a may then be introduced (with the areas of the IGFETs Q1 to Q5 and resistors covered) with the mask used to define the insulated gates still in place. This mask will overhang the insulated gates so that the central regions 24a will be spaced from the insulated gates. After removal of this mask, impurities for forming the remainder of the second or body regions 32, 32' are introduced with the areas in which these regions 32, 32' are not masked. After removal of this mask, a further mask is provided to allow introduction of the impurities to form the source regions 33, 33', regions 21 of the resistors and the source and drain regions 40 and 41 of the IGFETs Q1 to Q5. As will be appreciated by those skilled in the art, in respect of the MOSFETs 1 and 100, the insulated gates 34, 34' form at least part of the mask for forming the regions 32, 32' and 33, 33' so that these regions 32, 32' and 33, 33' are autoaligned to the insulated gates 34, 34'. A central area of each source region 33, 33' may be masked during the implantation process or may be subsequently etched away as shown in FIG. 3 to allow the source metallisation 36 to contact the central regions 32a, 32'a. As indicated above, if it is desired for the base of the parasitic bipolar transistor P to be floating rather than shorted to the emitter the central area of the source regions 33' of the auxiliary MOSFET 100 will not be so masked or etched.

An insulating layer 37 is then provided and contact holes opened to enable metallisation to be deposited and defined to provide the source electrodes 36 and gate electrodes (not shown) of the MOSFETs 1, the shorted source-gate metallisation of the auxiliary MOSFET 100, the electrodes 22 to 24 of the resistors R1 to R8 and the source, gate and drain electrodes of the IGFETs Q1 to Q5 plus appropriate interconnections in accordance with the circuit shown in FIG. 1. The metallisation 17 is also provided on the other major surface 10c to form the drain electrodes of the MOSFETs 1, 100.

The operation of the circuit shown in FIG. 1 will now be described. As indicated above, the thermally responsive device 100 comprises a base-emitter shorted parasitic bipolar transistor P provided by a few device cells 11' of the power MOSFET 1. As shown in FIG. 2, the cells 11' forming the transistor P are at the edge of the power MOSFET 1 to facilitate contact but they could be at the centre of the power MOSFET 1, so as to enable a faster and more accurate detection of the maximum temperature within the power MOSFET 1. Alternatively, the transistor P could be formed by a group of cells 11' remote from the power MOSFET 1 but formed at the same time.

The parasitic bipolar transistor P senses or experiences the temperature of the power MOSFET 1 and the current through the base-emitter shorted bipolar transistor increases with the temperature of the power MOSFET 1. Typically, the current supplied by the parasitic bipolar transistor P will effectively double for each ten degree Celsius increase in temperature. The parasitic bipolar P supplies current for the source-degeneration resistor R5 which allows the voltage at junction X in FIG. 1 to increase as the temperature sensed (and thus the current supplied) by the parasitic bipolar transistor P increases until the voltage at junction X equals the voltage at point Y so that the drain currents of the current-mirror connected transistors Q1 and Q2 are equal. As the current supplied by the bipolar transistor P and thus the voltage at junction X increases, the IGFET Q2 will become increasingly turned off and the voltage at junction W will rise to turn on IGFET Q3 and thus switch off IGFET Q4 so that the gate voltage of the IGFET Q5 rises causing the IGFET Q5 to turn on (or conduct) so as to pull the gate voltage of the power MOSFET 1 down towards the voltage of the second power supply line 4 and thus switch off the power MOSFET 1 once a predetermined temperature is exceeded.

The actual predetermined temperature at which the circuit 2 provides an output signal to switch off the power MOSFET 1 will of course depend upon the particular nature of the various circuit components but may be, typically, a temperature in the range of from 180° C. to 190° C. (degrees Celsius).

Although the parasitic npn bipolar transistor P has a high voltage blocking capability and this method for detecting the leakage current enhances the useful lower working range of the sensor, it will of course be appreciated that other thermally responsive devices, for example pn junction diodes, passing a current which increases with temperature could be used in place of the parasitic bipolar transistor P in the circuit 1 shown in FIG. 1.

In addition, the parasitic bipolar transistor P may be used in temperature sensing circuits other than that described with reference to FIG. 1, for example in circuits similar to that described in the above-cited U.S. Pat. No. 4,730,228 or in published European application EP-A-360333 (PHB33491). Furthermore, two or more such parasitic bipolar transistors P may be provided in the same semiconductor body as a power MOSFET, to for example to provide a more accurate assessment of temperature by measuring and averaging the temperatures at different locations or to provide a differential temperature sensing circuit. For example parasitic bipolar transistors P may be used to form the temperature sensing devices of a differential temperature sensing circuit such as those described in published European application EP-A-479362 (PHB33667), the contents of which are incorporated herein by way of reference.

It will of course be appreciated that devices other than lateral IGFETs could be used to provide the transistors Q1 to Q4 or devices with similar appropriate characteristics.

Of course the conductivity types, and where appropriate the polarities, given above could be reversed. Also it is possible that the power semiconductor device 1 and thermally responsive device 100 could be lateral rather than vertical devices. In addition it may be possible to use semiconductor materials other than or in addition to silicon.

From a reading of the present disclosure, other modifications and variations will be apparent to persons skilled in the art. Such modifications and variations may involve other features which are already known in the semiconductor and analogue MOS circuit design arts and which may be used instead of or in addition to features already described herein. Although claims have been formulated in this application to particular combinations of features, applicants hereby give notice that claims to other features and/or combinations of other features may be formulated in other applications derived herefrom.

We claim:

1. A semiconductor switch comprising a power transistor and a temperature sensor integrated therewith for providing a control signal to switch off the power transistor when the sensor reaches a predetermined thermal condition;

said power transistor being an insulated gate field effect transistor formed by a semiconductor body (10) having therein a first region (13) of a first conductivity type adjacent a surface of said body and a plurality of device cells (11) in said body, each device cell (11) comprising
a second region (32) within said first region (13) and which is of a second conductivity type opposite to said first conductivity type;
a third region (33) within the second region (32) and which is of said first conductivity type; and
an insulated gate (34) overlying a conduction channel (35) formed thereby in said second region (32) for providing a gatable conductive path between the third region (33) and the first region (13);

said temperature sensor comprising a thermally responsive semiconductor device formed by a plurality of further device cells (11') within the semiconductor body (10), each said further device cell (11') comprising
a further second region (32') within said first region (13) and which is of said second conductivity type;
a further third region (33') within the further second region (32') and which is of said first conductivity type; and
a further insulated gate (34') overlying a conduction channel (35') formed thereby within the further second region (32'), said further gate (34') being electrically connected to either of said third and further third regions (33, 33');

said further device cells constituting a parasitic bipolar transistor having a leakage current which varies with temperature and from which the temperature sensor derives a control signal for switching off the power transistor when said predetermined thermal condition is reached.

2. A semiconductor switch according to claim 1, wherein the third region (33') of each further device cell (11') is electrically connected to the second region (32') thereof.

3. A semiconductor switch according to claim 1, wherein at least the second regions (32) of the power transistor each have therein a more highly doped central area.

4. A semiconductor switch according to claim 1, wherein the further device cells of the temperature sensor are provided adjacent the periphery of the power (semiconductor device) transistor.

5. A semiconductor switch according to claim 1, wherein the further device cells of the temperature sensor are provided amongst the device cells of the power (semiconductor device) transistor.

6. A semiconductor switch according to claim 1, wherein the temperature sensor further comprises: a second thermally responsive Semiconductor device similar to the first-named thermally responsive semiconductor device, one of the two thermally responsive semiconductor devices being provided adjacent and the other remote from the power transistor; and means responsive to the leakage currents of the two thermally responsive devices for deriving said control signal to switch off the power transistor when the difference in the temperatures sensed by the two thermally responsive semiconductor devices exceeds a predetermined value.

7. A semiconductor switch according to claim 2, wherein at least the second regions (32) of the power transistor each have therein a more highly doped central area.

8. A semiconductor switch according to claim 2, wherein the further device cells of the temperature sensor are provided adjacent the periphery of the power transistor.

9. A semiconductor switch according to claim 3, wherein the further device cells of the temperature sensor are provided adjacent the periphery of the power transistor.

10. A semiconductor switch according to claim 2, wherein the further device cells of the temperature sensor are provided amongst the device cells of the power transistor.

11. A semiconductor switch according to claim 2, wherein the temperature sensor further comprises: a second thermally responsive semiconductor device similar to the first-named thermally responsive semiconductor device, one of the two thermally responsive semiconductor devices being provided adjacent and the other remote from the power transistor; and means responsive to the leakage currents of the two thermally responsive devices for deriving said control signal to switch off the power transistor when the difference in the temperatures sensed by the two thermally responsive semiconductor devices exceeds a predetermined value.

* * * * *